US008872271B2

(12) United States Patent
Hokazono (10) Patent No.: US 8,872,271 B2
(45) Date of Patent: Oct. 28, 2014

(54) PASS GATE, SEMICONDUCTOR MEMORY, AND SEMICONDUCTOR DEVICE

(71) Applicant: Kabushiki Kaisha Toshiba, Tokyo (JP)

(72) Inventor: Akira Hokazono, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/758,540

(22) Filed: Feb. 4, 2013

(65) Prior Publication Data

US 2014/0091396 A1 Apr. 3, 2014

(30) Foreign Application Priority Data

Sep. 28, 2012 (JP) ................................ 2012-216733

(51) Int. Cl.
*H01L 21/70* (2006.01)
*H01L 27/11* (2006.01)

(52) U.S. Cl.
CPC ...................................... *H01L 27/11* (2013.01)
USPC ........................................................ 257/368

(58) Field of Classification Search
CPC .................... H01L 2924/14369; H01L 27/11; H01L 27/1114
USPC ........... 257/368, E21.661, E27.098; 365/174, 365/175, 154–156; 438/FOR. 189
See application file for complete search history.

(56) References Cited

U.S. PATENT DOCUMENTS

| | | | |
|---|---|---|---|
| 5,046,044 A * | 9/1991 | Houston et al. ................ 365/156 |
| 5,267,192 A | 11/1993 | Nogami |
| 5,512,771 A * | 4/1996 | Hiroki et al. ................... 257/369 |
| 5,592,415 A * | 1/1997 | Kato et al. ................ 365/185.01 |
| 5,672,898 A * | 9/1997 | Keller et al. .................... 257/383 |
| 5,691,935 A * | 11/1997 | Douglass ....................... 365/149 |
| 5,831,897 A * | 11/1998 | Hodges .......................... 365/156 |
| 7,400,524 B2 * | 7/2008 | Otsuka .......................... 365/154 |
| 8,526,228 B2 * | 9/2013 | Chang et al. ................... 365/175 |
| 2005/0213383 A1 * | 9/2005 | Kato et al. ................ 365/185.11 |

(Continued)

FOREIGN PATENT DOCUMENTS

| | | |
|---|---|---|
| JP | 4-113587 A | 4/1992 |
| JP | 2007-122818 A | 5/2007 |
| JP | 2009-087459 A | 4/2009 |

OTHER PUBLICATIONS

Xuebei and Monhanram, Kartik Robust 6T Si Tunneling Transistor SRAM design. Design, Automation & Test in Europe Conference & Exhibition, pp. 1-6 (Mar. 14-18, 2011).*

(Continued)

*Primary Examiner* — Matthew Landau
*Assistant Examiner* — Eric Ashbahian
(74) *Attorney, Agent, or Firm* — Holtz, Holtz, Goodman & Chick PC (57) ABSTRACT

According to one embodiment, a pass gate provided between a data holding unit of an SRAM cell and a bit line, includes a first tunnel transistor and a first diode connected in series between the data holding unit and the bit line, and a second tunnel transistor and a second diode connected in series between the data holding unit and the bit line and connected in parallel to the first tunnel transistor and the first diode. Gate electrodes of the first tunnel transistor and the second tunnel transistor are connected to a word line. The first diode and the second diode have rectification in mutually opposite directions between the data holding unit and the bit line.

19 Claims, 9 Drawing Sheets

(56) References Cited

U.S. PATENT DOCUMENTS

| | | |
|---|---|---|
| 2007/0097729 A1 | 5/2007 | Otsuka |
| 2009/0086536 A1 | 4/2009 | Kitagawa et al. |
| 2011/0031552 A1* | 2/2011 | Iwamatsu et al. ............. 257/347 |
| 2013/0176770 A1* | 7/2013 | Chang et al. .................. 365/154 |

OTHER PUBLICATIONS

Nirschl Th. et al.: "Scaling properties of the tunneling field effect transistor (TFET): Device and circuit": Solid-State Electronics 50 (2006): pp. 44-51 (in English).

\* cited by examiner

PASS GATE, SEMICONDUCTOR MEMORY, AND SEMICONDUCTOR DEVICE

CROSS REFERENCE TO RELATED APPLICATION

This application is based upon and claims benefit of priority from the Japanese Patent Application No. 2012-216733, filed on Sep. 28, 2012, the entire contents of which are incorporated herein by reference.

FIELD

Embodiments described herein relate generally to a pass gate, a semiconductor memory, and a semiconductor device.

BACKGROUND

SRAM (Static Random Access Memory) is used as RAM realizing a higher speed and a larger capacity. A conventional SRAM cell is provided with a storage cell constituted of a first inverter and a second inverter cross-connected to each other, and a pass gate provided between the storage cell and a bit line. The pass gate is, for example, MOSFET provided between an input terminal of the first inverter and an output terminal of the second inverter and the bit line. The storage cell is connected to the bit line through the MOSFET to read out or write in data.

DETAILED DESCRIPTION

According to one embodiment, a pass gate provided between a data holding unit of an SRAM cell and a bit line, includes a first tunnel transistor and a first diode connected in series between the data holding unit and the bit line, and a second tunnel transistor and a second diode connected in series between the data holding unit and the bit line and connected in parallel to the first tunnel transistor and the first diode. Gate electrodes of the first tunnel transistor and the second tunnel transistor are connected to a word line. The first diode and the second diode have rectification in mutually opposite directions between the data holding unit and the bit line.

Before the description of embodiments of the present invention, a process during which the present inventors made the present invention will be described.

Figure 1A:
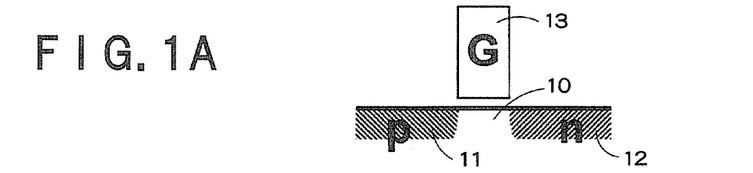
FIG. 1A is a schematic diagram of a tunnel transistor.
Figure 1B:
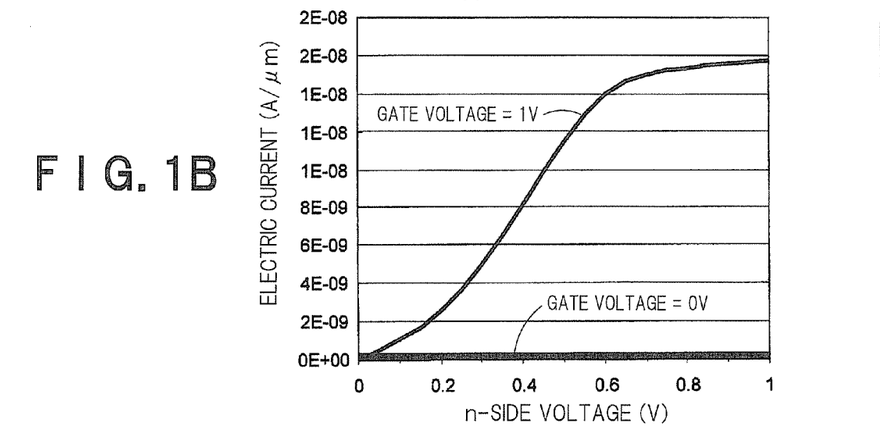
FIGS. 1B and 1C are graphs showing a relationship between an applied voltage and an electric current of the tunnel transistor.

FIG. 1A is a schematic diagram of a tunnel transistor, in which a p-type diffusion layer 11 and an n-type diffusion layer 12 are provided in a substrate 10 so as to hold a gate electrode 13 therebetween. FIG. 1B is a graph showing a relationship between a voltage applied to the n-type diffusion layer 12 and an electric current flowing through the tunnel transistor when a voltage applied to the p-type diffusion layer 11 is 0 V and a gate voltage is 1 V or 0 V. From FIG. 1B, it can be seen that turning on/off of the tunnel transistor can be controlled by the gate voltage.

Figure 1C:
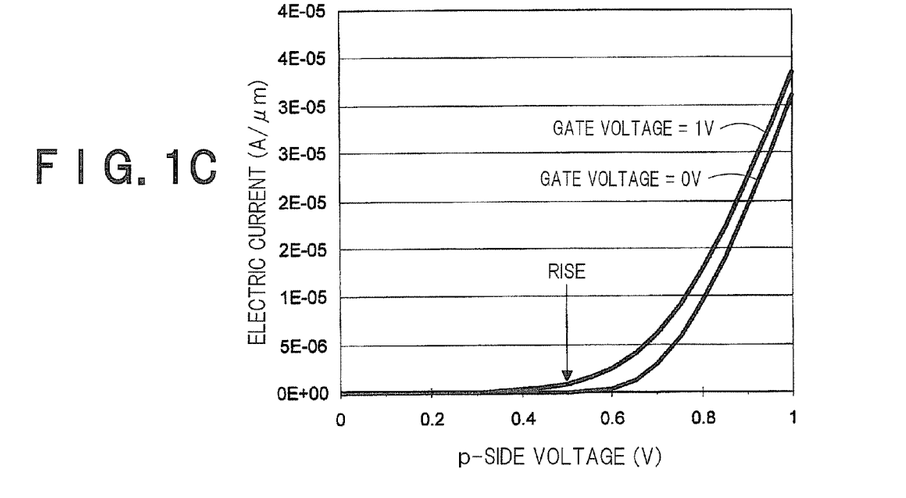

FIG. 1C is a graph showing a relationship between the voltage applied to the p-type diffusion layer 11 and the electric current flowing through the tunnel transistor, that is, forward characteristics of pn junction, when the voltage applied to the n-type diffusion layer 12 is 0 V and the gate voltage is 1 V or 0 V. From FIG. 1C, it can be seen that regardless of the gate voltage, the tunnel transistor is turned on (electric current flows therethrough) when the voltage applied to the p-type diffusion layer 11 is more than 0.5 V. Namely, a forward bias threshold voltage of the pn junction is about 0.5 V. The forward bias threshold voltage has temperature dependence and is reduced to approximately 0.4 V at high temperature.

When this TFET is used in the SRAM pass gate, in order to prevent malfunctions in, for example, writing-in or reading-out data of a non-selected cell, the SRAM is required to be operated at such an extremely low voltage as not more than the forward bias threshold voltage (0.5 V or 0.4 V), and the voltage setting is severely restricted.

In the following embodiments, the above problems are to be solved. Hereinafter, the embodiments according to the present invention will be described based on the drawings.

First Embodiment

Figure 2:
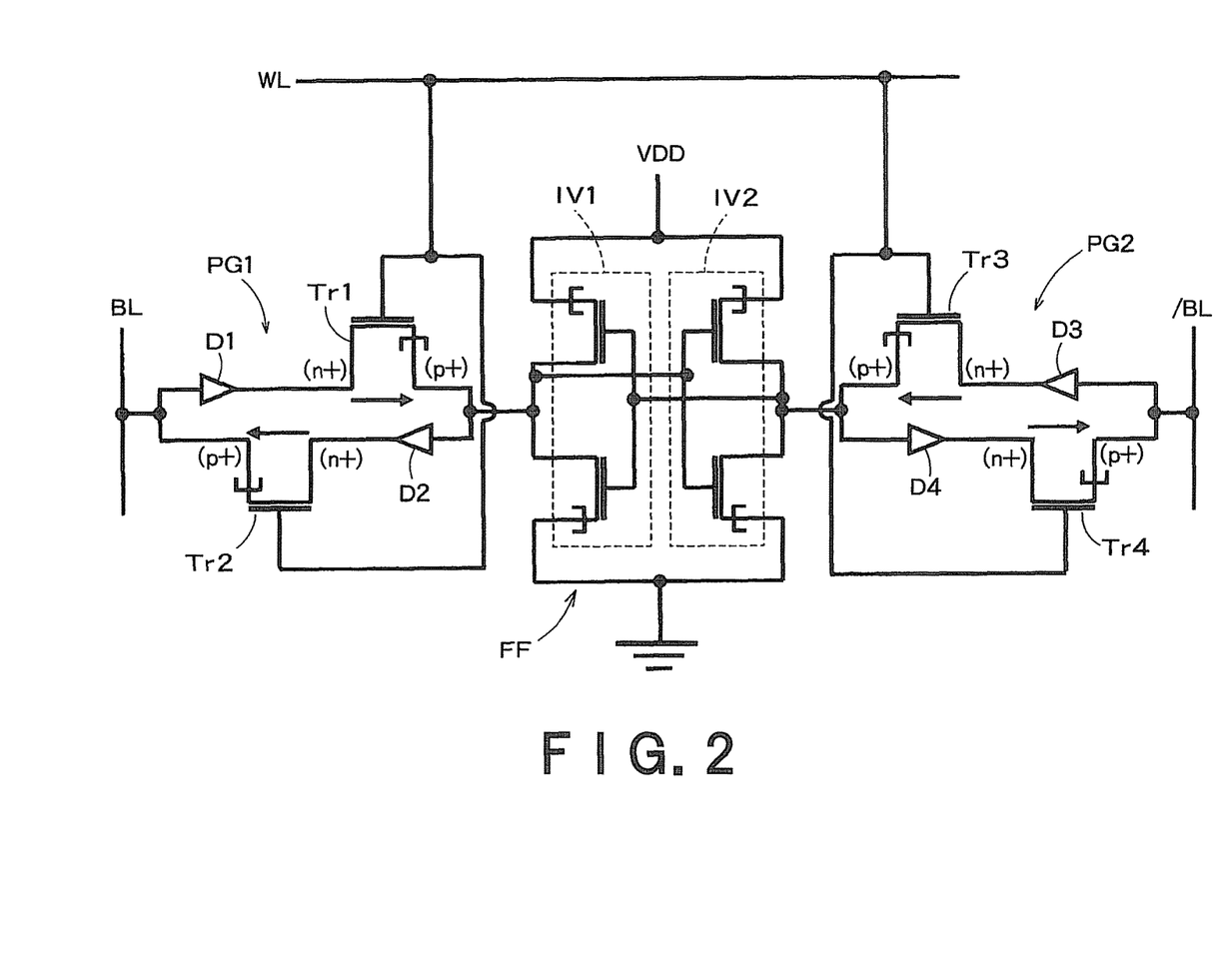
FIG. 2 is a circuit diagram of a memory cell according to a first embodiment.

FIG. 2 is a circuit diagram of a memory cell of SRAM according to a first embodiment. The memory cell is connected to pair of bit lines BL and /BL and a word line WL provided in a direction perpendicular to the bit line pair BL and /BL. In FIG. 2, although one memory cell is shown, a plurality of the bit line pairs BL and /BL and a plurality of the word lines WL are provided, and the memory cells are provided at the respective intersections between the bit line pairs BL and /BL and the word lines WL.

As shown in FIG. 2, the memory cell is provided with a first inverter IV1, a second inverter IV2, a first pass gate PG1, and a second pass gate PG2. A flip-flop FF (data holding unit) is configured by cross-coupling the output and input terminals of the first inverter IV1 and the second inverter IV2.

A first pass gate PG1 is provided between the flip-flop FF and the bit line BL, and a second pass gate PG2 is provided between the flip-flop FF and the bit line /BL. The flip-flop FF is connected to the bit line pair BL and /BL through the first pass gate PG1 and the second pass gate PG2, and data is read out or written.

The first pass gate PG1 has transistors Tr1 and Tr2 being n-type TFETs and diodes D1 and D2.

In the transistor Tr1, a gate electrode is connected to the word line WL, a p-type source region is connected to the output of the first inverter IV1 and the input of the second inverter IV2, and an n-type drain region is connected to a cathode of the diode D1. An anode of the diode D1 is connected to the bit line BL. The diode D1 has rectification in the same direction as the operation direction of the transistor Tr1.

In the transistor Tr2, a gate electrode is connected to the word line WL, a p-type source region is connected to the bit line BL, and an n-type drain region is connected to a cathode of the diode D2. An anode of the diode D2 is connected to the output of the first inverter IV1 and the input of the second inverter IV2. The diode D2 has rectification in the same direction as the operation direction of the transistor Tr2. Namely, the diode D1 and the diode D2 have rectification in mutually opposite directions between the flip-flop FF and the bit line BL.

The second pass gate PG2 has transistors Tr3 and Tr4 being n-type TFETs and diodes D3 and D4.

In the transistor Tr3, a gate electrode is connected to the word line WL, a p-type source region is connected to the output of the second inverter IV2 and the input of the first inverter IV1, and an n-type drain region is connected to a cathode of the diode D3. An anode of the diode D3 is connected to the bit line /BL. The diode D3 has rectification in the same direction as the operation direction of the transistor Tr3.

In the transistor Tr4, a gate electrode is connected to the word line WL, a p-type source region is connected to the bit line /BL, and an n-type drain region is connected to a cathode of the diode D4. An anode of the diode D4 is connected to the output of the second inverter IV2 and the input of the first inverter IV1. The diode D4 has rectification in the same direction as the operation direction of the transistor Tr4. Namely, the diode D3 and the diode D4 have rectifications in mutually opposite directions between the flip-flop FF and the bit line /BL.

The current directions of the transistors Tr1 to Tr4 are defined by the diodes D1 to D4, and a reverse flow of an electric current can be prevented.

When the diodes D1 to D4 are not provided, the electric potential of the word line WL is set to a low level. Even if the memory cell is in a non-selected state, the transistors Tr1 to Tr4 are turned on (see, FIG. 1) when the voltage applied to the transistors Tr1 to Tr4 being TFETs is high, thereby wrong data may be written in or read out. When the diodes D1 to D4 are not provided, in order to prevent malfunctions, it is necessary that a power supply voltage VDD be extremely reduced and the voltage applied to the transistors Tr1 to Tr4 be reduced.

To deal with the problem, in the present embodiment, the diodes D1 to D4 are provided, the current direction of the transistors Tr1 to Tr4 is defined, and the reverse flow is prevented. The voltage applied to the transistors Tr1 to Tr4 which are the TFETs is reduced by a built-in electric potential of the diodes D1 to D4. In other words, the power supply voltage VDD can be increased. Accordingly, the malfunctions can be prevented while easing restrictions on the power supply voltage VDD.

Next, a method of manufacturing the above SRAM pass gate will be described using the process cross-sectional views shown in FIGS. 3A to 3H. FIGS. 3A to 3H correspond to the transistor Tr3 and the diode D3 connected in series. Since each of the methods of manufacturing the transistors Tr1, Tr2, and Tr4 and the diodes D1, D2, and D4 is similar to the method of manufacturing the transistor Tr3 and the diode D3, the description will not be repeated.

Figure 3A:
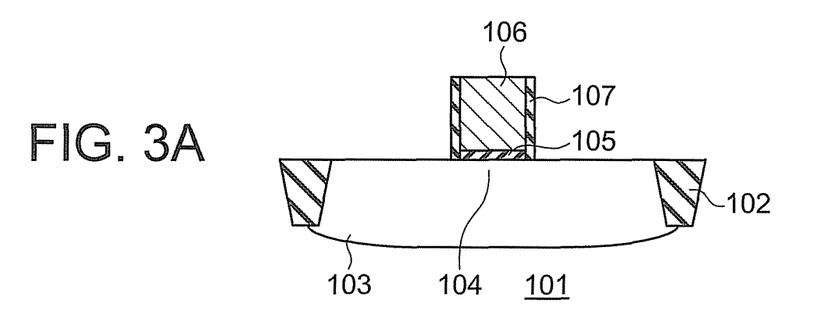
FIGS. 3A to 3H are process cross-sectional views for explaining a method of manufacturing an SRAM pass gate according to the first embodiment.

First, as shown in FIG. 3A, an element separation insulating film 102 having a depth of 2000 to 3000 Å is formed on a silicon substrate 101 by a buried element separation method. Subsequently, activation by ion implantation and RTA (Rapid Thermal Anneal) is performed, and a well region 103 and a channel region 104 are formed. For example, boron is implanted at an accelerating energy of 260 keV in a dose amount of $2.0 \times 10^{13}/cm^2$ to form the well region 103 of p-type. Further, arsenic is implanted at an accelerating energy of 80 keV in a dose amount of $1.0 \times 10^{13}/cm^2$ to form the channel region 104. A threshold voltage in tunnel junction can be adjusted by the channel ion implantation.

Subsequently, a polysilicon gate electrode 106 having a film thickness of 500 to 2000 Å is deposited on a gate insulating film 105 having a film thickness of 5 to 60 Å formed by a thermal oxidation method or an LPCVD method, and pre-doping to the gate electrode 106 is performed. After that, gate patterning is performed by an optical lithography method, an X-ray lithography method, or an electron beam lithography method. Then, the gate electrode 106 and the gate insulating film 105 are etched by a reactive ion etching (RIE) method. In the gate insulating film 105, a silicon dioxide film, a silicon nitride film, and a silicon oxynitride film may be used, for example, or a high dielectric film such as HfSiON may be used. The gate electrode 106 may be a metal gate.

Subsequently, a post-oxidized $SiO_2$ (not shown) is formed by the thermal oxidation method. Then, a silicon nitride film is formed to be anisotropically-etched by RIE, and, thus, to form an offset spacer (first gate side wall film) 107.

Figure 3B:
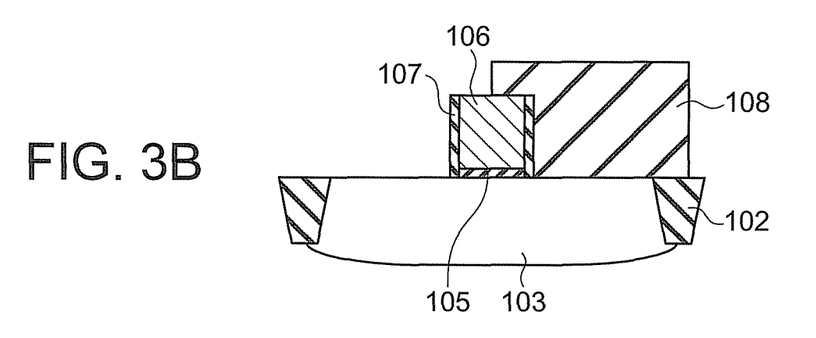

Then, as shown in FIG. 3B, a resist 108 is applied, and the resist 108 is processed so that a source side (left side in the drawing) is exposed by lithography processing. At this time, a drain side (right side in the drawing) is covered by the resist 108.

Figure 3C:
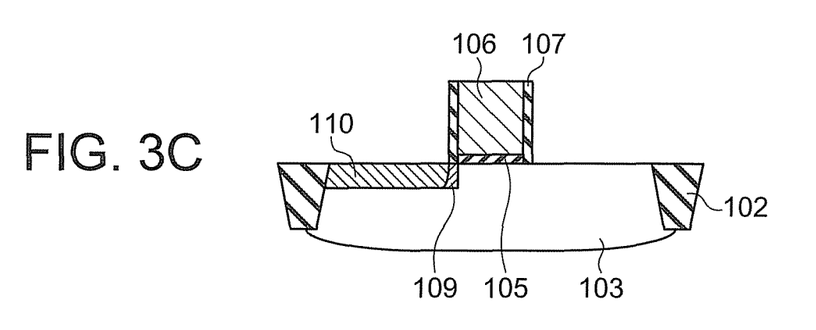

Next, as shown in FIG. 3C, the ion implantation for the formation of the tunnel junction is performed, and the resist 108 is peeled. For example, arsenic is implanted at an accelerating energy of 40 keV in a dose amount of $3.0 \times 10^{13}/cm^2$ at a predetermined incident angle to form an n-type region 109. $BF_2$ is implanted at an accelerating energy of 2 keV in a dose amount of $1.0 \times 10^{15}/cm^2$ to form a p-type region 110.

Figure 3D:
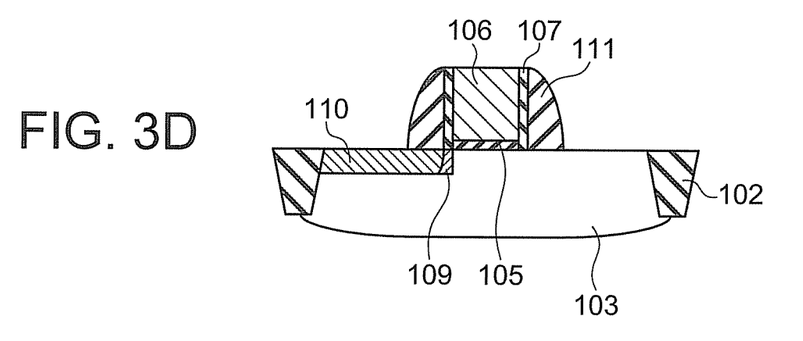

Next, as shown in FIG. 3D, a TEOS film with a film thickness of 500 Å is formed to be anisotropically-etched by RIE, and, thus, to form a second gate side wall film 111.

Figure 3E:
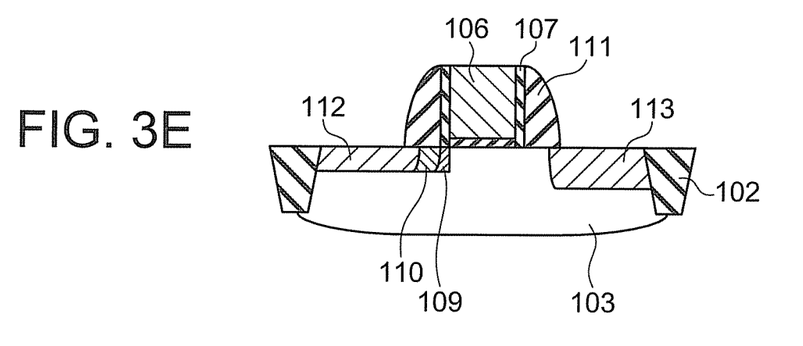

Next, as shown in FIG. 3E, the source side is exposed to form a resist (not shown) covering the drain side, and, thus, to perform ion implantation, whereby a p-type high concentration diffusion layer (source region) 112 is formed. For example, boron is implanted at an accelerating energy of 3 keV in a dose amount of $2.0 \times 10^{15}/cm^2$.

After the resist is peeled off, the drain side is exposed to form a resist (not shown) covering the source side and ion implantation is performed, whereby an n-type high concentration diffusion layer (drain region) 113 is formed. For example, arsenic is implanted at an accelerating energy of 20 keV in a dose amount of $1.0 \times 10^{15}/cm^2$. At this stage, an n-type TFET (transistor Tr3) is realized.

Figure 3F:
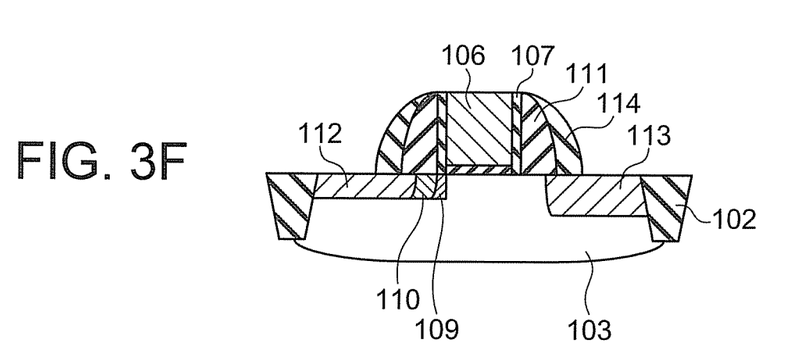

Next, as shown in FIG. 3F, a silicon nitride film with a film thickness of approximately 500 Å is formed to be anisotropically-etched by RIE, and, thus, to form a third gate side wall film 114.

Figure 3G:
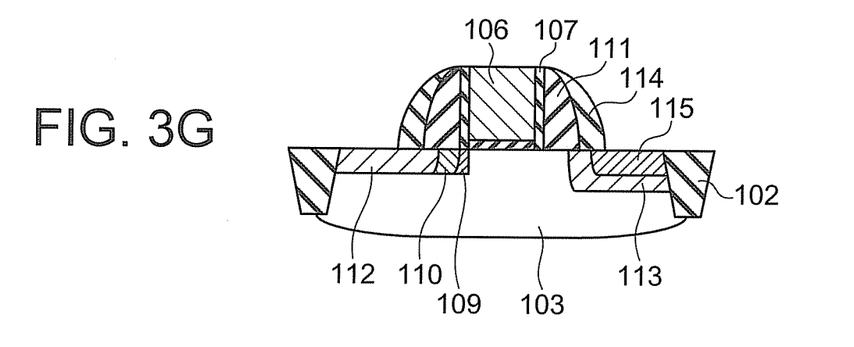

Next, as shown in FIG. 3G, the drain side is exposed to form a resist (not shown) covering the source side and ion implantation is performed, whereby a p-type high concentration diffusion layer 115 is formed. For example, boron is implanted at an accelerating energy of 1 keV in a dose amount of $1.5 \times 10^{15}/cm^2$. The p-type high concentration diffusion layer 115 is formed so as to be enwrapped with the n-type high concentration diffusion layer (source region) 113, that is, not to be in contact with the well region 103. By virtue of the pn junction between the p-type high concentration diffusion layer 115 and the n-type high concentration diffusion layer 113, the p-type high concentration diffusion layer 115 functions as a diode (diode D3).

Figure 3H:
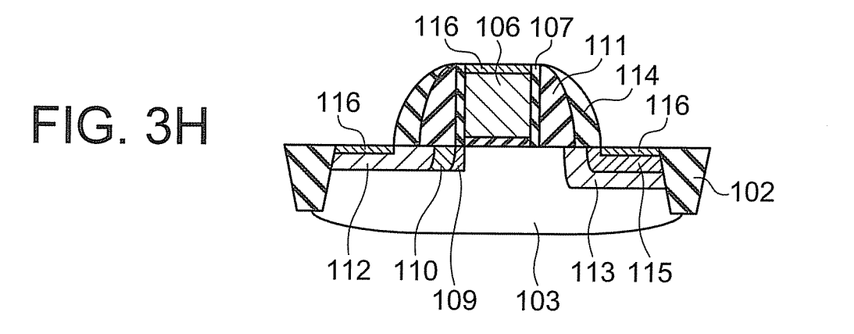

Next, as shown in FIG. 3H, a natural oxide film is removed by hydrofluoric acid treatment, and a silicide layer 116 is formed by a salicide process. The silicide layer 116 is nickel silicide, for example. The silicide layers 116 are formed in the source region, the drain region, and an upper surface of the gate electrode 106.

After that, an insulating film (for example, TEOS, BPSG, SiN) covering the TFET is deposited, and a planarization processing using CMP is performed. Then, a contact plug, which is connected to the source region and the drain region, and a wire layer are formed, whereby a semiconductor device is realized.

In this manner, a diode limiting a direction in which an electric current with TFET characteristics flows can be formed on the drain side of the TFET. When this TFET and the diode are applied to the pass gate of the SRAM, the voltage applied to the TFET can be reduced by the built-in electric potential of the diode, and therefore, the malfunctions can be prevented while easing restrictions on the power supply voltage VDD. The built-in electric potential of the diode depends on the characteristics of the diode and can be adjusted under doping conditions in the process shown in FIG. 3G.

Second Embodiment

Although the diode is formed in the TFET in the first embodiment, the diode may be formed in a region other than the TFET.

Figure 4A:
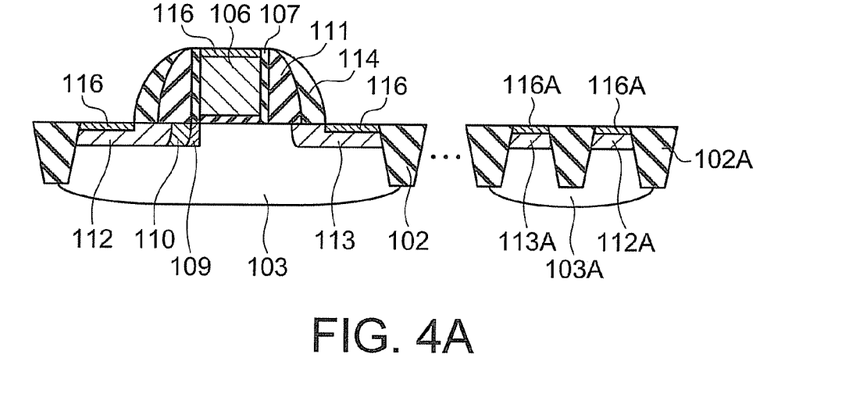
FIGS. 4A and 4B are process cross-sectional views for explaining a method of manufacturing an SRAM pass gate according to a second embodiment.

For example, as shown in FIG. 4A, the diode is formed near the TFET. An element separation insulating film 102A, a well region 103A, a p-type high concentration diffusion layer 112A, an n-type high concentration diffusion layer 113A, and a silicide layer 116A in the diode formation region can be respectively formed by the same processes as the element separation insulating film 102, the well region 103, the p-type high concentration diffusion layer 112, the n-type high concentration diffusion layer 113, and the silicide layer 116 of the TFET.

Figure 4B:
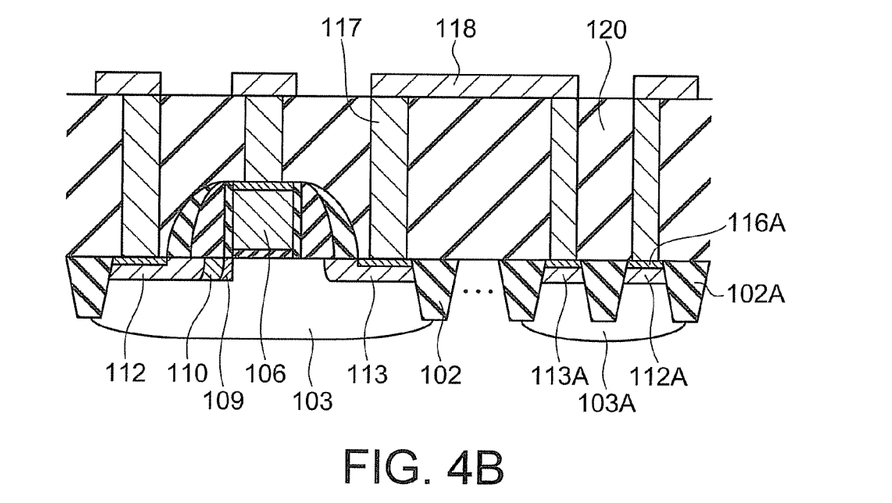

Next, as shown in FIG. 4B, an insulating film 120 is formed on a substrate 101. Then, a contact plug 117 penetrating through the insulating film 120 and connecting to a source region, a drain region, a gate electrode, and a diode of the TFET is formed. Subsequently, a metal wiring 118 is formed on the insulating film 120.

The TFET and the diode are formed in different regions, whereby the TFET and the diode can be produced under conditions suitable for each of them.

Third Embodiment

A method of manufacturing an SRAM pass gate according to a third embodiment will be described using the process cross-sectional views shown in FIGS. 5A and 5B.

Since a flow from a start to a process for forming a third gate side wall film 114 shown in FIG. 3H is similar to that in the first embodiment, the description will not be repeated.

Figure 5A:
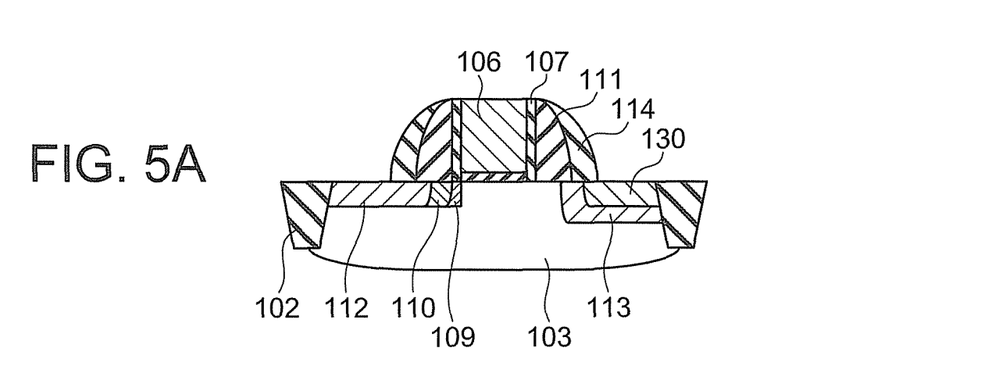
FIGS. 5A and 5B are process cross-sectional views for explaining a method of manufacturing an SRAM pass gate according to a third embodiment.

After the formation of the third gate side wall film 114, as shown in FIG. 5A, a drain side is exposed to form a resist (not shown) covering a source side and ion implantation is performed, whereby an n-type low concentration diffusion layer 130 is formed. For example, boron is implanted in an n-type high concentration diffusion layer 113 at an accelerating energy of 1 keV in a dose amount of $5.0 \times 10^{14}/cm^2$ to convert a surface portion of the n-type high concentration diffusion layer 113 into the n-type low concentration diffusion layer 130.

Figure 5B:
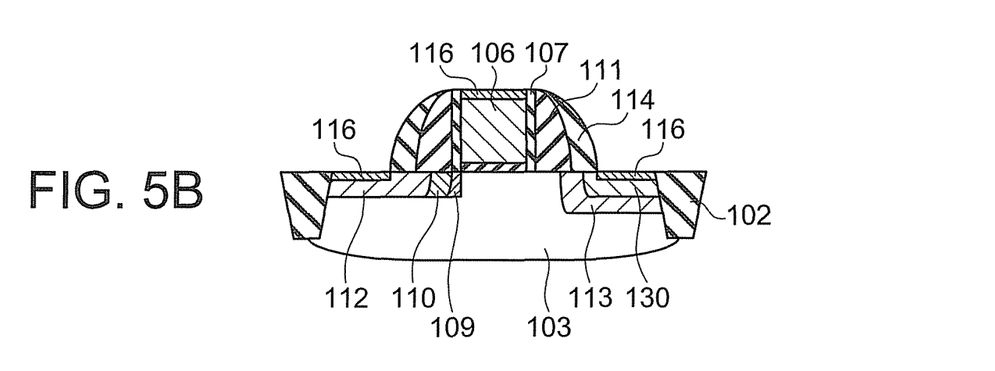

Next, as shown in FIG. 5B, a natural oxide film is removed by hydrofluoric acid treatment, and a silicide layer 116 is formed by a salicide process. The silicide layer 116 is nickel silicide, for example. According to this constitution, a diode is formed by schottky junction, and a diode having rectification from the silicide layer 116 to the n-type low concentration diffusion layer 130 is realized.

In this manner, a diode limiting a direction in which an electric current with TFET characteristics flows can be formed on the drain side of the TFET.

Variation of First Embodiment

Figure 6:
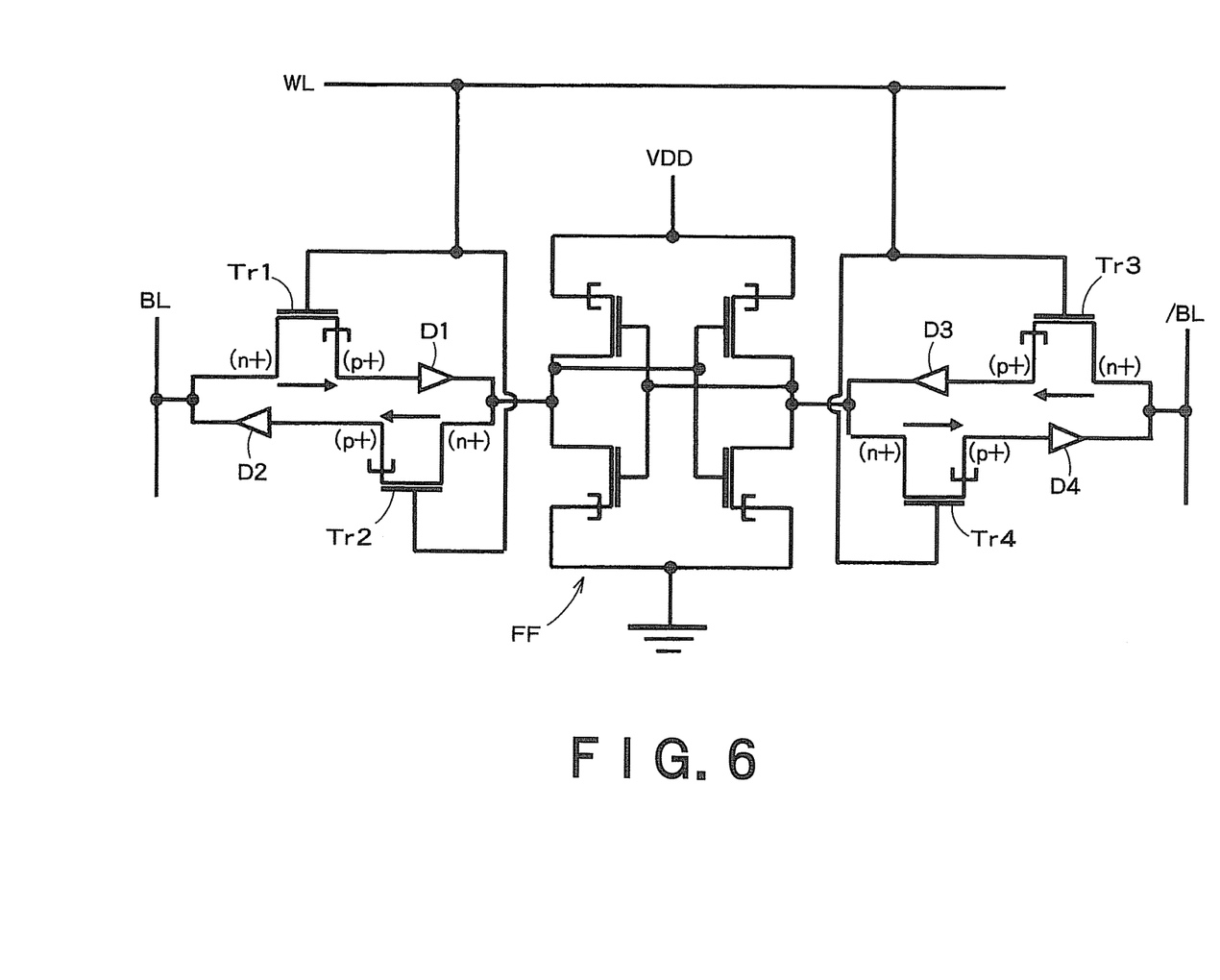
FIG. 6 is a circuit diagram of a memory cell according to a variation of the first embodiment.

Although in the first embodiment the diodes D1 to D4 are provided on the drain sides of the transistors Tr1 to Tr4, the diodes D1 to D4 may be provided on the source sides of the transistors Tr1 to Tr4 as shown in FIG. 6.

Figure 7:
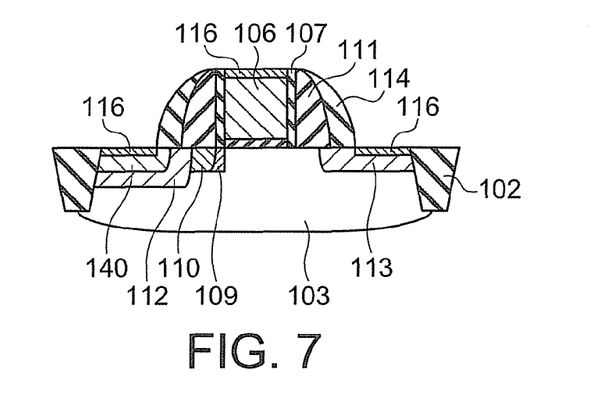
FIG. 7 is a cross-sectional view of an SRAM pass gate according to a variation of the first embodiment.

For example, as shown in FIG. 7, the p-type high concentration diffusion layer 115 on the drain side (see FIG. 3H) is not provided, and an n-type high concentration diffusion layer 140 is formed on the source side. By virtue of the pn junction between the n-type high concentration diffusion layer 140 and the p-type high concentration diffusion layer 112, the n-type high concentration diffusion layer 140 functions as a diode (diode D3).

For example, the p-type high concentration diffusion layer 112 is formed by being implanted with boron at an accelerating energy of 4 keV in a dose amount of $2.0 \times 10^{15}/cm^2$.

For example, the n-type high concentration diffusion layer 140 is formed by being implanted with arsenic at an accelerating energy of 5 keV in a dose amount of $2.0 \times 10^{15}/cm^2$.

Variation of Second Embodiment

Figure 8:
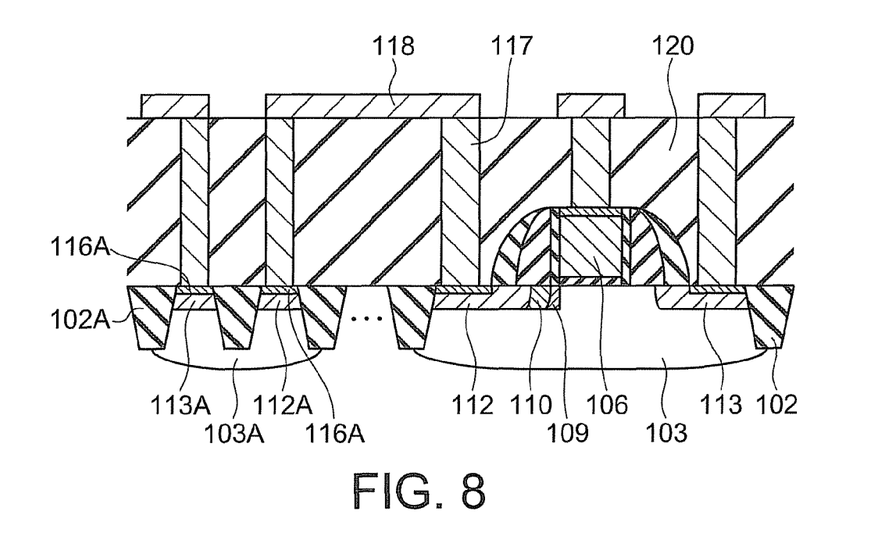
FIG. 8 is a cross-sectional view of an SRAM pass gate according to a variation of the second embodiment.

Although, in the second embodiment, the diode wire-connected to the drain region of the TFET is shown in FIG. 4B, the diode may be wire-connected to the source region of the TFET as shown in FIG. 8. Consequently, the diode may be provided on the source side of the transistor as shown in FIG. 6.

Variation of Third Embodiment

Figure 9:
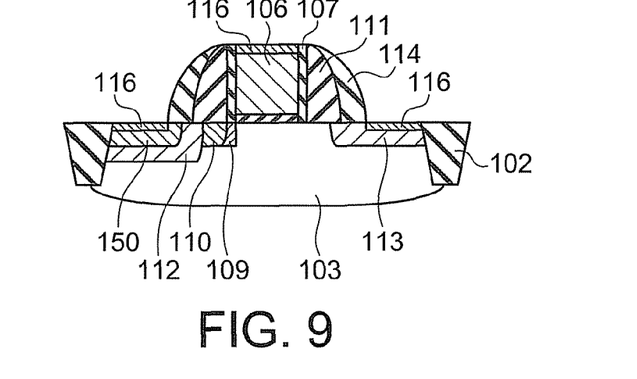
FIG. 9 is a cross-sectional view of an SRAM pass gate according to a variation of the third embodiment.

Although, in the third embodiment, the schottky junction is formed in the drain region of the TFET as shown in FIG. 5B, the schottky junction may be formed in the source region of the TFET as shown in FIG. 9.

As shown in FIG. 9, the n-type low concentration diffusion layer 130 (see FIG. 5B) is not provided, and a p-type low concentration diffusion layer 150 is formed on a surface portion of the p-type high concentration diffusion layer 112. For example, boron is implanted at an accelerating energy of 4 keV in a dose amount of $2.0 \times 10^{15}/cm^2$ to form the p-type high concentration diffusion layer 112. Then, arsenic is implanted in the surface portion of the p-type high concentration diffusion layer 112 at an accelerating energy of 5 keV in a dose amount of $5.0 \times 10^{14}/cm^2$ to form the p-type low concentration diffusion layer 150.

Consequently, a diode having rectification from the silicide layer 116 to the p-type low concentration diffusion layer 150 on the source side is realized.

Although, in the first to third embodiments, an example in which the n-type TFET is used in the SRAM pass gate has been described, the p-type TFET may be alternatively used.

In this case, the polarity of respective portions is reversed. For example, in the process shown in FIG. 3A, phosphorus is implanted at an accelerating energy of 500 keV in a dose amount of $3.0 \times 10^{13}/cm^2$ to form an n-type well region 103, and thereafter, boron is implanted at an accelerating energy of 10 keV in a dose amount of $1.5 \times 10^{13}/cm^2$ to form the channel region 104.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pass gate provided between a data holding unit of an SRAM cell and a bit line, comprising:
    a first tunnel transistor and a first diode connected in series between the data holding unit and the bit line; and
    a second tunnel transistor and a second diode connected in series between the data holding unit and the bit line and connected in parallel to the first tunnel transistor and the first diode,
    wherein:
    gate electrodes of the first tunnel transistor and the second tunnel transistor are connected to a word line;
    the first diode and the second diode have rectification in mutually opposite directions between the data holding unit and the bit line;
    the first tunnel transistor and the second tunnel transistor are n-type tunnel transistors having an n-type drain region and a p-type source region;
    the first diode has rectification in a same direction as an operation direction of the first tunnel transistor; and
    the second diode has rectification in a same direction as an operation direction of the second tunnel transistor.

2. The pass gate according to claim 1, wherein
    the first diode is provided between the n-type drain region of the first tunnel transistor and the bit line, and
    the second diode is provided between an n-type drain region of the second tunnel transistor and the data holding unit.

3. The pass gate according to claim 2, wherein
    the first tunnel transistor and the first diode are provided in different regions of a semiconductor substrate, and
    the n-type drain region of the first tunnel transistor is connected to the first diode through a contact plug and a wire layer.

4. The pass gate according to claim 2, wherein
    the n-type drain region and the p-type source region of the first tunnel transistor are provided on the semiconductor substrate, and
    a p-type impurity diffusion layer is formed on a surface portion of the n-type drain region.

5. The pass gate according to claim 2, wherein
    the n-type drain region and the p-type source region of the first tunnel transistor are provided on the semiconductor substrate,
    an n-type impurity diffusion layer having an impurity concentration lower than that of the n-type drain region is formed on the surface portion of the n-type drain region, and
    a silicide layer is formed on a surface of the n-type impurity diffusion layer.

6. The pass gate according to claim 1, wherein
    the first diode is provided between the p-type source region of the first tunnel transistor and the data holding unit, and
    the second diode is provided between the p-type source region of the second tunnel transistor and the bit line.

7. The pass gate according to claim 6, wherein
    the first tunnel transistor and the first diode are provided in different regions of a semiconductor substrate, and
    the p-type source region of the first tunnel transistor is connected to the first diode through a contact plug and a wire layer.

8. The pass gate according to claim 6, wherein
    the n-type drain region and the p-type source region of the first tunnel transistor are provided on the semiconductor substrate, and
    an n-type impurity diffusion layer is formed on a surface portion of the p-type source region.

9. The pass gate according to claim 6, wherein
    the n-type drain region and the p-type source region of the first tunnel transistor are provided on a semiconductor substrate,
    a p-type impurity diffusion layer having an impurity concentration lower than that of the p-type source region is formed on a surface portion of the p-type source region, and
    a silicide layer is formed on a surface of the p-type impurity diffusion layer.

10. A semiconductor memory comprising:
    a plurality of bit lines;
    a plurality of word lines arranged in a direction perpendicular to the plurality of bit lines; and
    an SRAM cell which is provided at each of intersections between the plurality of bit lines and the plurality of word lines, and has a data holding unit and a pass gate provided between the data holding unit and the bit line;
    wherein:
    the pass gate comprises (i) a first tunnel transistor and a first diode connected in series between the data holding unit and the bit line, and (ii) a second tunnel transistor and a second diode connected in series between the data holding unit and the bit line and being connected in parallel to the first tunnel transistor and the first diode;
    gate electrodes of the first tunnel transistor and the second tunnel transistor are connected to the word line;
    the first diode and the second diode have rectification in mutually opposite directions between the data holding unit and the bit line;
    the first tunnel transistor and the second tunnel transistor are n-type tunnel transistors having an n-type drain region and a p-type source region;
    the first diode has rectification in a same direction as an operation direction of the first tunnel transistor; and
    the second diode has rectification in a same direction as an operation direction of the second tunnel transistor.

11. The semiconductor memory according to claim 10, wherein the data holding unit has a flip-flop in which output and input of the first inverter and the second inverter are cross-coupled to each other.

12. The semiconductor memory according to claim 10, wherein:
    the first diode is provided between the n-type drain region of the first tunnel transistor and the bit line, and
    the second diode is provided between the n-type drain region of the second tunnel transistor and the data holding unit.

13. The semiconductor memory according to claim 12, wherein
 the first tunnel transistor and the first diode are provided in different regions of a semiconductor substrate, and
 the n-type drain region of the first tunnel transistor is connected to the first diode through a contact plug and a wire layer.

14. The semiconductor memory according to claim 12, wherein
 the n-type drain region and the p-type source region of the first tunnel transistor are provided on the semiconductor substrate, and
 a p-type impurity diffusion layer is formed on a surface portion of the n-type drain region.

15. The semiconductor memory according to claim 12, wherein
 the n-type drain region and the p-type source region of the first tunnel transistor are provided on the semiconductor substrate,
 an n-type impurity diffusion layer having an impurity concentration lower than that of the n-type drain region is formed on the surface portion of the n-type drain region, and
 a silicide layer is formed on a surface of the n-type impurity diffusion layer.

16. The semiconductor memory according to claim 10, wherein
 the first diode is provided between the p-type source region of the first tunnel transistor and the data holding unit, and
 the second diode is provided between the p-type source region of the second tunnel transistor and the bit line.

17. The semiconductor memory according to claim 16, wherein
 the first tunnel transistor and the first diode are provided in different regions of the semiconductor substrate, and
 the p-type source region of the first tunnel transistor is connected to the first diode through a contact plug and a wire layer.

18. The semiconductor memory according to claim 16, wherein
 the n-type drain region and the p-type source region of the first tunnel transistor are provided on the semiconductor substrate, and
 an n-type impurity diffusion layer is formed on a surface portion of the p-type source region.

19. The semiconductor memory according to claim 16, wherein
 the n-type drain region and the p-type source region of the first tunnel transistor are provided on the semiconductor substrate,
 a p-type impurity diffusion layer having an impurity concentration lower than that of the p-type source region is formed on the surface portion of the p-type source region, and
 a silicide layer is formed on a surface of the p-type impurity diffusion layer.

* * * * *